United States Patent [19]
Choi et al.

[11] Patent Number: 5,889,305
[45] Date of Patent: *Mar. 30, 1999

[54] NON-VOLATILE SEMICONDUCTOR MEMORY DEVICE HAVING STORAGE CELL ARRAY AND PERIPHERAL CIRCUIT

[75] Inventors: Jeong-Hyeok Choi, Seoul; Keon-Soo Kim, Suwon, both of Rep. of Korea

[73] Assignee: SamSung Electronics Co., Ltd., Suwon, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 753,684

[22] Filed: Nov. 27, 1996

Related U.S. Application Data

[62] Division of Ser. No. 686,392, Apr. 17, 1991, Pat. No. 5,656,527.

[30] Foreign Application Priority Data

Sep. 22, 1990 [KR] Rep. of Korea ................. 1990/15098

[51] Int. Cl.⁶ .................................................. H01L 29/788
[52] U.S. Cl. ............................................ 257/324; 257/316
[58] Field of Search ...................................... 257/314–316, 257/321, 324, 649, 412, 529

[56] References Cited

U.S. PATENT DOCUMENTS

| | | | |
|---|---|---|---|
| 5,063,431 | 11/1991 | Ohshima | 257/649 |
| 5,149,667 | 9/1992 | Choi | 257/412 |
| 5,150,179 | 9/1992 | Gill | 257/315 |
| 5,158,902 | 10/1992 | Hanada | 437/43 |
| 5,661,330 | 8/1997 | Aimi et al. | 257/529 |

*Primary Examiner*—David B. Hardy
*Attorney, Agent, or Firm*—Robert E. Bushnell, Esq.

[57] ABSTRACT

In a non-volatile semiconductor memory device having a storage cell array and a peripheral circuit, the thickness of a gate oxide layer of the peripheral circuit area is independent of the formation of an O—N—O insulation layer on the storage cell area. A floating gate of a storage cell array is formed as a first conductive layer on a semiconductor substrate, an O—N—O insulation layer covering the floating gate is formed on the top surface of the substrate, and a gate oxide layer of the peripheral circuit area is formed by making an oxide layer on the top surface of the substrate after removing the O—N—O insulation layer on the top surface of the peripheral circuit area. The O—N—O insulation layer is solely formed on the top and side surfaces of the floating gate in the direction of word lines and absent from side surfaces of the floating gate in the direction of bit lines.

13 Claims, 9 Drawing Sheets

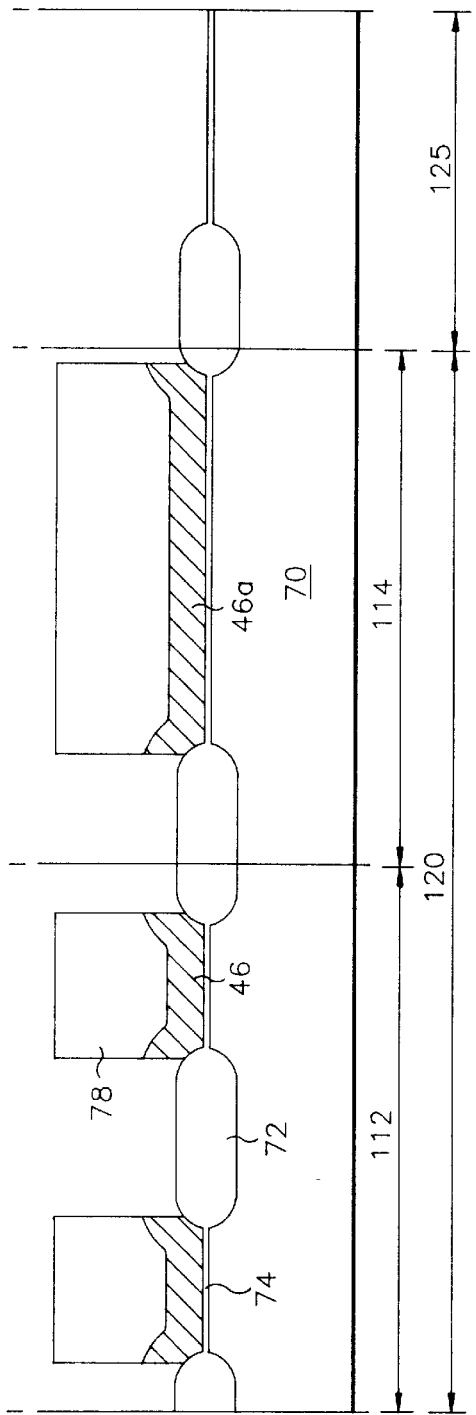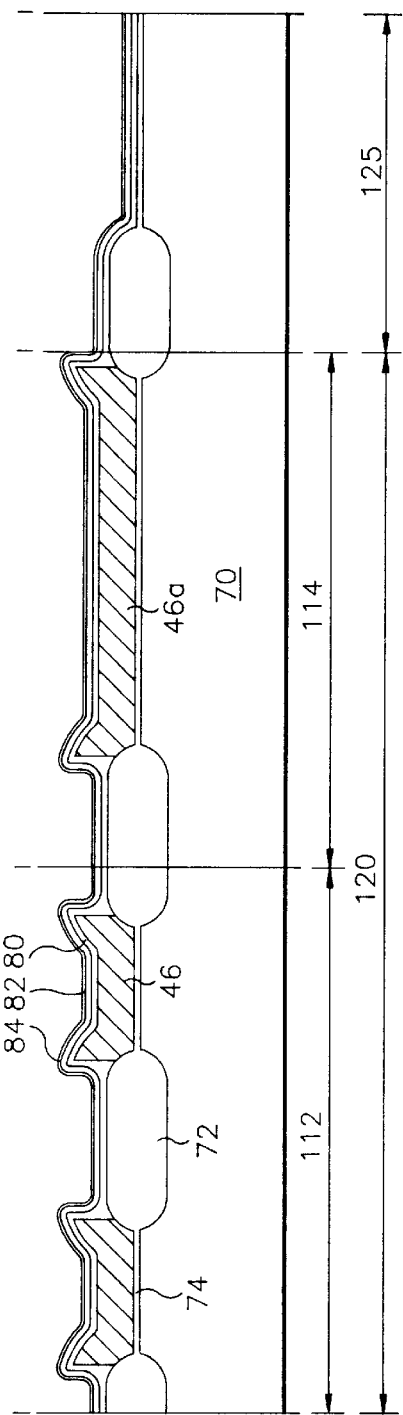

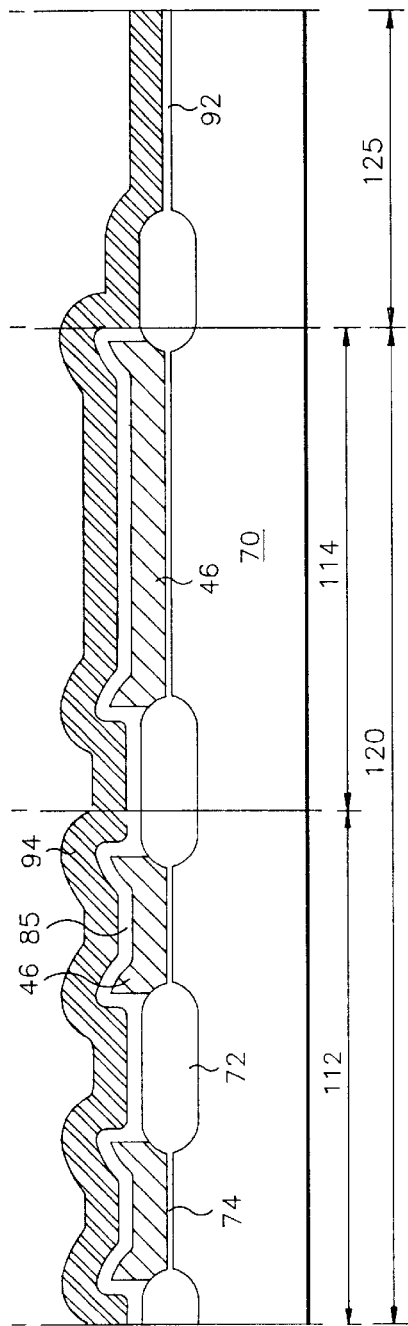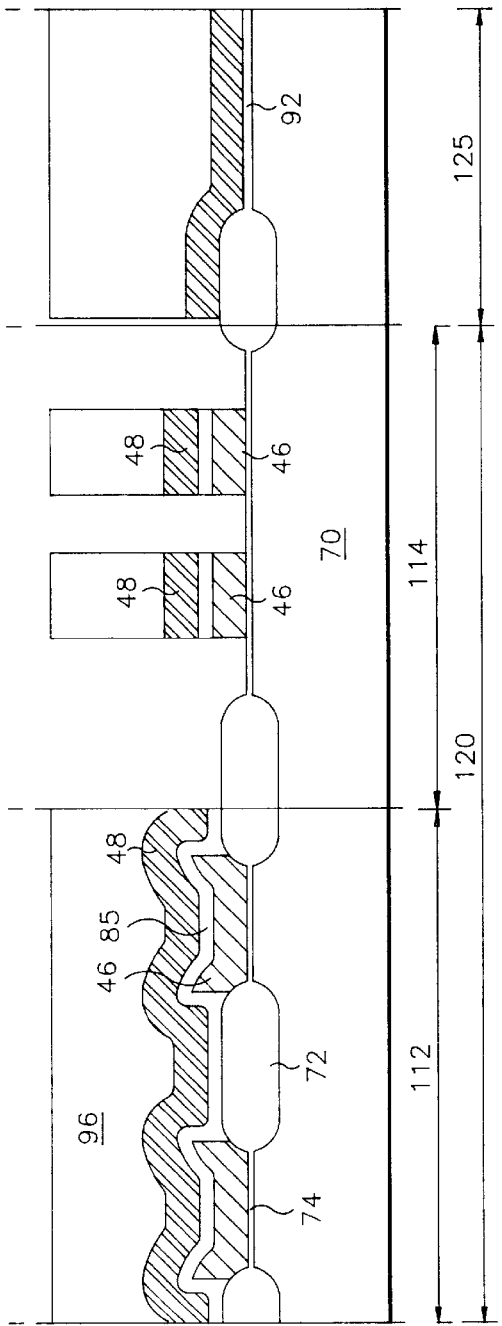

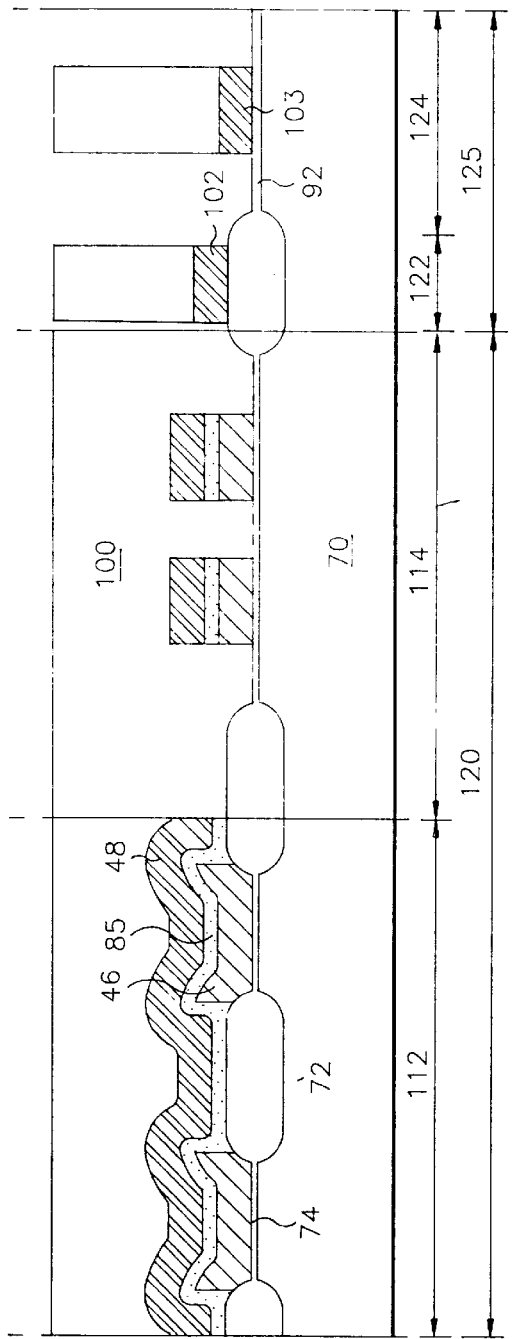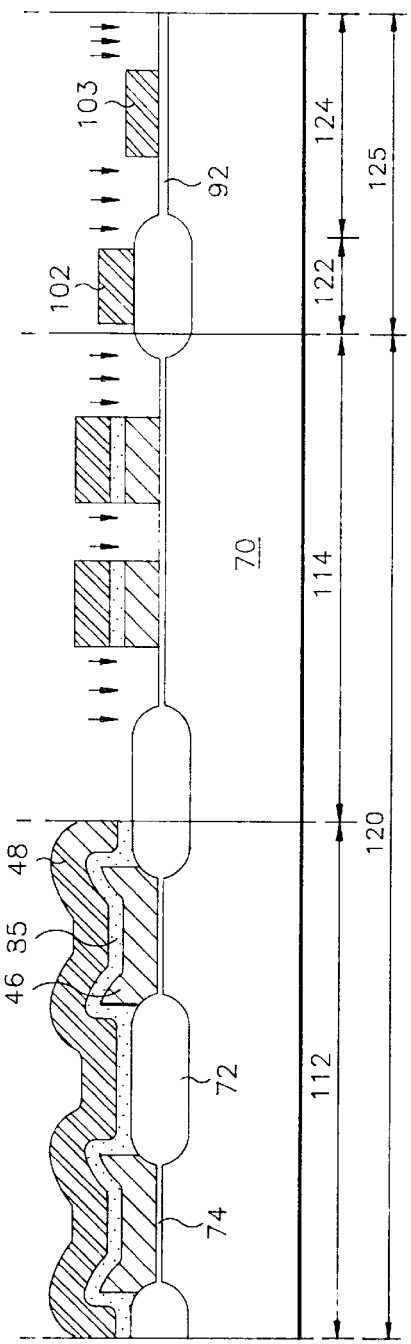

NON-VOLATILE SEMICONDUCTOR MEMORY DEVICE HAVING STORAGE CELL ARRAY AND PERIPHERAL CIRCUIT

CROSS-REFERENCE TO RELATED APPLICATION

This patent application is a divisional application of U.S. patent application Ser. No. 07/686,392, filed on 17 Apr. 1991, now issued as U.S. Pat. No. 5,656,527 which makes reference thereto, incorporate the same therein, and claims all benefits accruing under 35 U.S.C. § 119 for an application entitled A Method For Fabricating A Non-Volatile Semiconductor Memory Device Having Storage Cell Array And Peripheral Circuit, And A Structure Thereof earlier filed in the Korean Industrial Property Office on 22 Sep. 1990, and there duly assigned Ser. No. 15098/1990.

BACKGROUND OF THE INVENTION

The present invention relates to a semiconductor memory device a method for fabricating, and more particularly to non-volatile semiconductor memory devices having a storage cell array including therein an Electrically Programmable Read-Only-Memory (hereinafter referred to as EPROM) or Electrically Erasable and Programmable Read-Only-Memory (hereinafter referred to as EEPROM) and having a peripheral circuit which consists of MOS transistors.

Among non-volatile semiconductor memory devices, EPROM and EEPROM devices have a floating gate and a control gate deposited on a semiconductor substrate having a source and a drain thereon. Basic structures of the EPROM and EEPROM are disclosed in U.S. Pat. No. 3,500,142.

In general, as disclosed in the aforesaid U.S. patent, an EPROM is programmed by injecting hot electrons to floating gates from channel area and the program is erased by exposing the memory device under ultra-violet rays. Likewise, the EEPROM is programmed by tunneling of electrons from drain area to floating gates and the program is erased by tunneling of electrons from the floating gates to the drain area. Here, the capacitance required for programming operation of EPROM, or programming or erasing operation of EEPROM, is secured by an insulation layer formed between the floating gate and the control gate above the floating gate.

In case of EEPROM, for example, programming or writing operation is performed by tunneling of electrons from a drain to a floating gate by applying a high voltage and a ground voltage to the control gate and the drain, respectively, and floating the source, while erasing or reading operation is performed by tunneling of electrons from the floating gate to the drain by applying a high voltage to the drain and grounding the control gate while the source is in floating state. In programming, a voltage between a floating gate and a substrate can be described by the following expression:

$$V_{FG} = \frac{C_1}{C_1 + C_2} \cdot V_{PP} \quad (1)$$

wherein a voltage applied to the control gate is represented by $V_{pp}$, a capacitance between the control gate and a floating gate is represented by $C_1$, a capacitance between the floating gate and a substrate is represented by $C_2$, a voltage between the floating gate and the substrate is represented by $V_{FG}$ Here, the larger the $V_{FG}$ is, the stronger electric field is induced between the floating gate and the substrate, and accordingly the tunneling characteristics of electrons is improved. Hence, in order to improve the tunneling effect of electrons, value of the $V_{FG}$ needs to be increased. As obvious from the expression (1), increase of the capacitance $C_1$ between the control gate and the floating gate is required to increase the value of $V_{FG}$ in a given voltage $V_{pp}$. However, since semiconductor devices are nowadays getting more highly integrated and becoming smaller and smaller, which inevitably leads to a reduced space for containing the semiconductor, it is necessary to find a solution to overcome the decrease of capacitance caused by such reduced space of cell occupation in a semiconductor device having storage cell array, which consists of a floating gate memory, and peripheral circuits.

As a solution, it has been proposed to use a O—N—O (Oxide-Nitride-Oxide) layer, which has a greater permittivity than silicon oxide layer, for forming an insulation layer between the floating gate and the control gate. The permittivity of the oxide layer is $\epsilon_{ox} \approx 3.9$ and permittivity of the O—N—O layer is $\epsilon_{sin} \approx 7.5$. Therefore, the O—N—O insulation can achieve a capacitance of about twice as much as that in the oxide layer insulation, in accordance with the following expression:

$$\text{Capacitance } C = \frac{\text{insulator permittivity } (e) \times \text{cross-section area } (s)}{\text{insulator thickness } (t)}$$

when the two layers have the same thickness (t) of insulation layer. Another proposal is to increase area of a capacitor to achieve a larger capacitance.

FIGS. 1A through 1E, as disclosed in U.S. Pat. No. 4,697,330, illustrate a part of fabrication process of a non-volatile semiconductor memory device having storage cell array and peripheral circuit according to the prior art. As shown in the figures, a semiconductor substrate 10 has a storage cell area 35 and a peripheral circuit area 40. As illustrated in FIG. 1A, after forming field oxide layer 12 on the semiconductor substrate 10 by employing a known local oxidation process, a gate insulation layer 14 is formed on the semiconductor substrate 10. And a first polycrystalline silicon layer 16, a first oxide layer 18 made of silicon oxide ($SiO_2$), a first nitride layer 20 made of silicon nitride ($Si_3N_4$) and a first photo-resist layer 22 are sequentially formed on the substrate 10, and a given mask pattern is formed thereon. Then, by a local etching process, a floating gate 16 of the storage cell area 35 is formed. The upper surface of the field oxide layer 12 and the bulk silicon substrate 10 of the peripheral circuit area 40 are exposed by this local etching.

As shown in FIG. 1B, after the photo-resist layer 22 is removed, a second oxide layer 26 made of silicon oxide layer is formed on the upper surface of the O—N layer over the storage cell area 35 and the upper surface of the exposed bulk silicon substrate 10 of the peripheral circuit area 40 by employing a thermal oxidation method or oxide deposition. The second oxide layer 26, which is formed on the bulk silicon substrate 10, serves as a gate insulation layer for a MOS transistor of the peripheral area 40. On the other hand, when the second oxide layer 26 is being formed, a first polycrystalline silicon oxide layer 27 is formed onto the side of the floating gate 16 due to a sort of reaction between the polycrystalline silicon exposed on the side of the floating gate 16 and the second oxide layer. Thereafter, a second polycrystalline silicon layer 28 is formed on the top surface of the bulk silicon substrate 10.

As illustrated in FIG. 1C, a second photo-resist layer 30 is coated on the second polycrystalline silicon layer 28. And, after a mask pattern of the second photo-resist layer is formed, a control gate is etched so as to complete formation of a cell array of the storage cell area 35. Then, the second photo-resist layer 30 is removed, and a pattern is formed after coating a third photo-resist layer 32 on the entire surface of the substrate 10 so as to complete formation of a gate 33 of the MOS transistor of the peripheral circuit area 40, as illustrated in FIG. 1D.

FIG. 1E shows a cross-sectional view of a completed semiconductor device having a storage cell and peripheral circuit after the third photo-resist layer 32 is removed. In the drawing, it will be well known that a first polycrystalline silicon oxide layer 27 is thickly formed onto the side of the floating gate, referring to a cross-sectional view 36 in the direction of word line of the storage cell area 35. And it will be also clear that the floating and the control gates are formed in sequence in a bit-line direction, referring to a cross-section view 37 of the bit-line direction.

As understood from the foregoing description, when patterning of the floating gate is carried out after formation of the first polycrystalline silicon layer, the first silicon oxide layer 18 and the nitride layer 20, the O—N (Oxide-Nitride) layer itself alone formed of the silicon oxide layer 18 and nitride layer 20, is not enough to serve as a dielectric layer to block a leakage current caused by electric charge retention or any electric field. Therefore, as shown in FIG. 1B, the O—N—O layer has to be completed by forming the second silicon oxide layer 26 on the nitride layer 20. At this time, the second silicon oxide layer 26 is formed not only on the top surface of the nitride layer 20 of the O—N insulation layer but also on the top surface of exposed silicon substrate of the peripheral circuit area, and is then formed into a thick silicon oxide layer on the side of the floating gate.

As a consequence, the thickness of the gate oxide layer 26 of the peripheral circuit area 40 cannot be properly controlled because the growth rate of the oxide layer is different between on the top surface of the nitride layer 20 of the storage cell area 35 and on the top surface of the exposed silicon substrate. That is, since the second silicon oxide layer 26 formed on the surface of the nitride layer 20 requires a thickness of approximately 30 Å to maintain a sufficiently even layer quality, a thick formation of a gate oxide layer having a thickness of more than at least 300 Å is rendered on the surface of the exposed silicon substrate of the peripheral circuit area while the second silicon oxide layer is growing to such a thickness. Accordingly, the prior art has a drawback in that the thickness of the gate oxide layer of the peripheral circuit area could hardly be controlled in order to obtain an optimum thickness for effective circuit operation.

Attempts to obtain the optimum thickness inevitably result in insufficient layer quality of the second oxide layer 26 on the surface of the nitride layer 20. As these days there has been a trend towards a thinner gate oxide layer in MOS transistors, this drawback has led to further serious problems.

Meanwhile, when the second silicon oxide layer 20 is being formed, the polycrystalline silicon oxide layer 27, which is formed on the side of the floating gate 16, requires a thickness of more than 600 Å in order to get an electric field strength that can be obtained from the insulation layer of O—N—O structure. To meet these conditions, a method of doping the first polycrystalline silicon layer with impurities has been typically employed.

Accordingly, since the first polycrystalline silicon oxide layer 27 is formed with a substantial thickness, the capacitance obtained at the side of the floating gate having the polycrystalline silicon oxide layer 27 as an insulator, can hardly contribute to an increase of the total capacitance. Thus, the capacitance obtained at the storage cell area will be limited to a capacitance that can be obtained at the planar area of the top surface of the floating gate.

That is, the more that the semiconductor devices are integrated, the more that the planar area on the top surface of the floating gate is reduced, while the side area of the floating gate becomes larger. However, since the capacitance obtained at the storage cell area is limited to the capacitance that can be obtained at the planar area of the top surface of the floating gate, there is another drawback that sufficient capacitance for the optimum operation of a semiconductor device cannot be secured.

SUMMARY OF THE INVENTION

It is therefore an object of the present invention to provide a non-volatile semiconductor memory device having a storage cell array and a peripheral circuit, in which the thickness of the gate oxide layer of the peripheral circuit area is independent of the formation of the O—N—O insulation layer on the storage cell area.

It is another object of the present invention to provide a non-volatile semiconductor memory device having storage cell array and peripheral circuit, having sufficient capacitance for the optimum operation of the device independently of a decrease of a chip area due to a high integration of the semiconductor device.

It is still another object of the present invention to provide a non-volatile semiconductor memory device having a storage cell array and a peripheral circuit and having the structure wherein the top and side surface of a floating gate is covered by an O—N—O insulator layer.

To achieve the above objects and other advantages, according to a preferred embodiment of the present invention, a floating gate of a storage cell array is formed as a first conductive layer on a semiconductor substrate, an O—N—O insulation layer covering the floating gate is formed on the top surface of the substrate, and a gate oxide layer of peripheral circuit area is formed by making an oxide layer on the top surface of the substrate after removing the O—N—O insulation layer on the top surface of the peripheral circuit area.

The above and other objects, effects and features of he present invention will become more apparent from the following description of preferred embodiments thereof taken in conjunction with the accompanying drawings. Same reference numerals are used to designate similar parts throughout the figures.

BRIEF DESCRIPTION OF THE ATTACHED DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIGS. 4A to 4H show a fabrication sequence of a semiconductor device according to the present invention.

DETAILED DESCRIPTION OF THE INVENTION

Figure 1A:
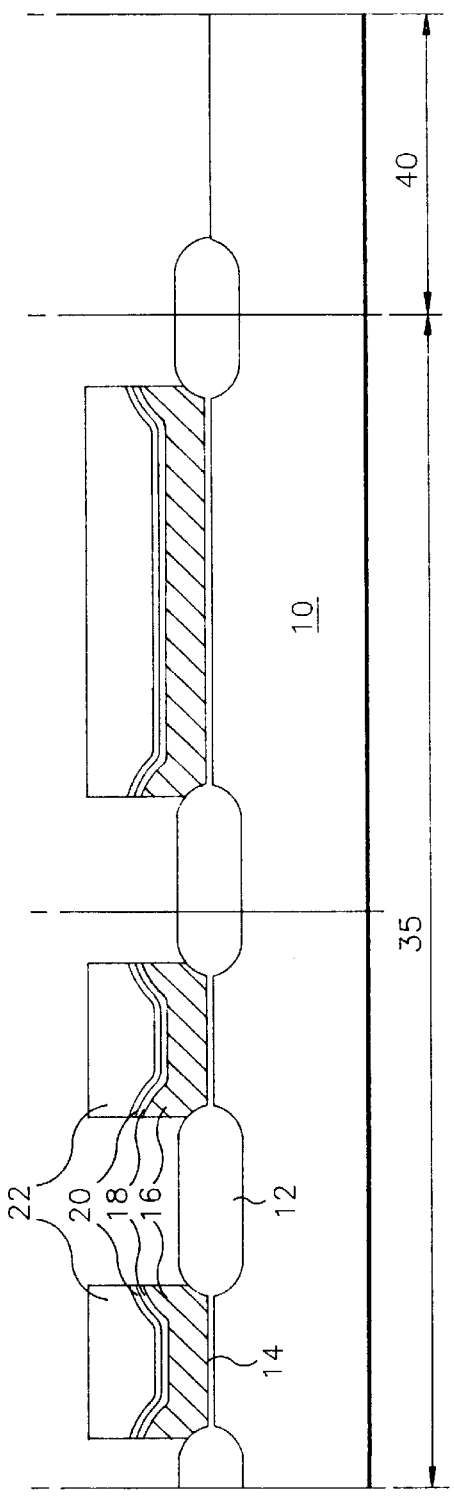
FIGS. 1A to 1E show a prior art fabrication sequence.
Figure 1B:
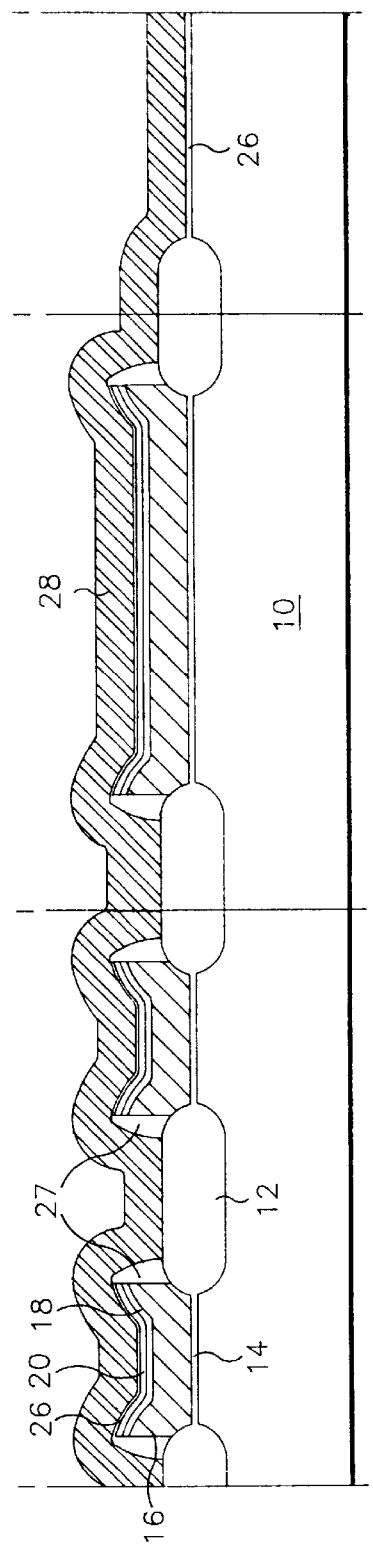
Figure 1C:
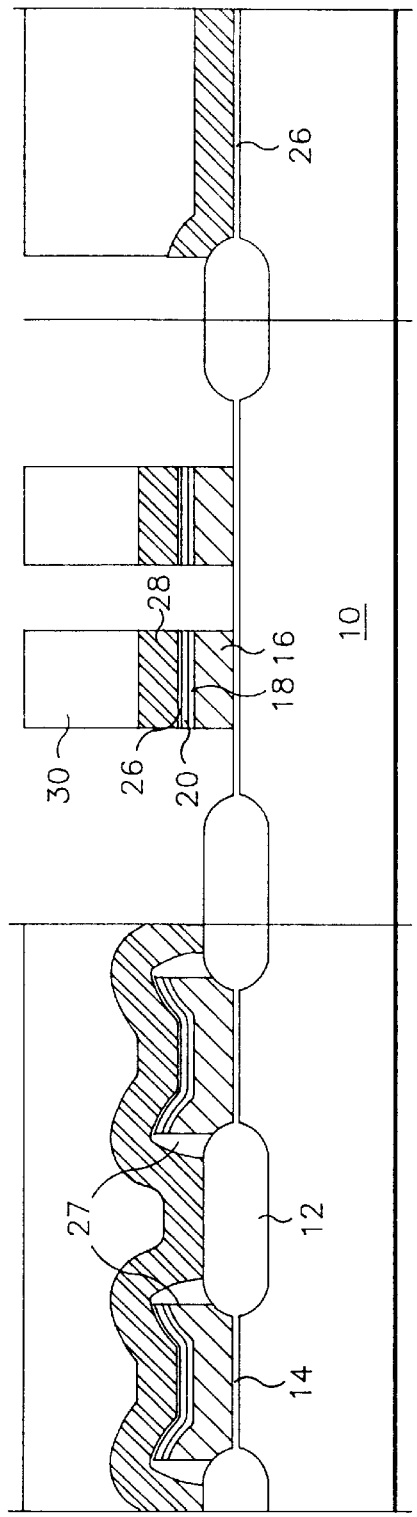
Figure 1D:
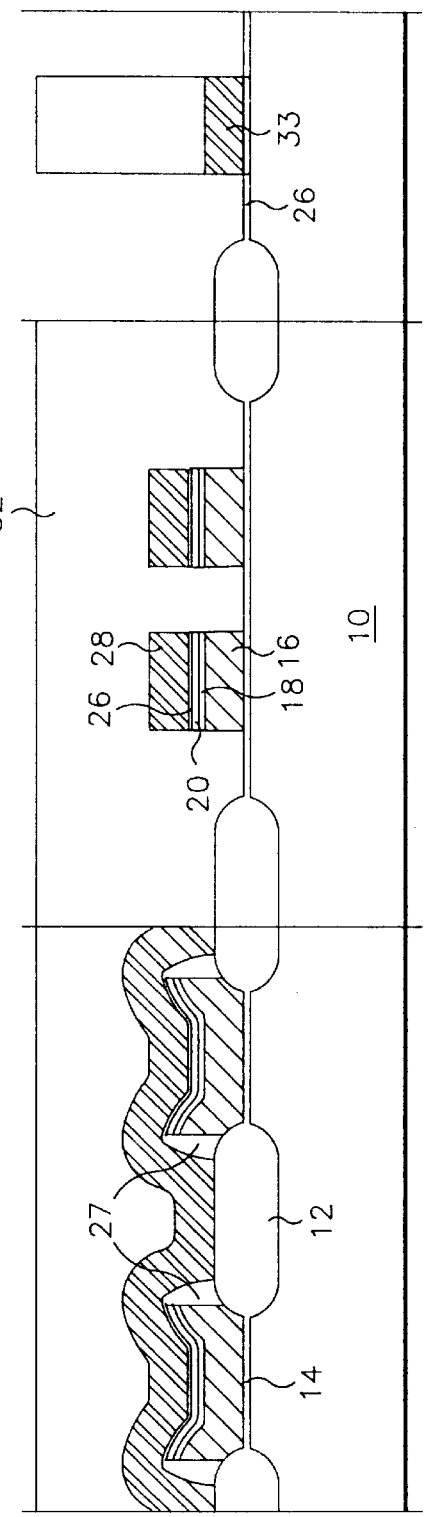
Figure 1E:
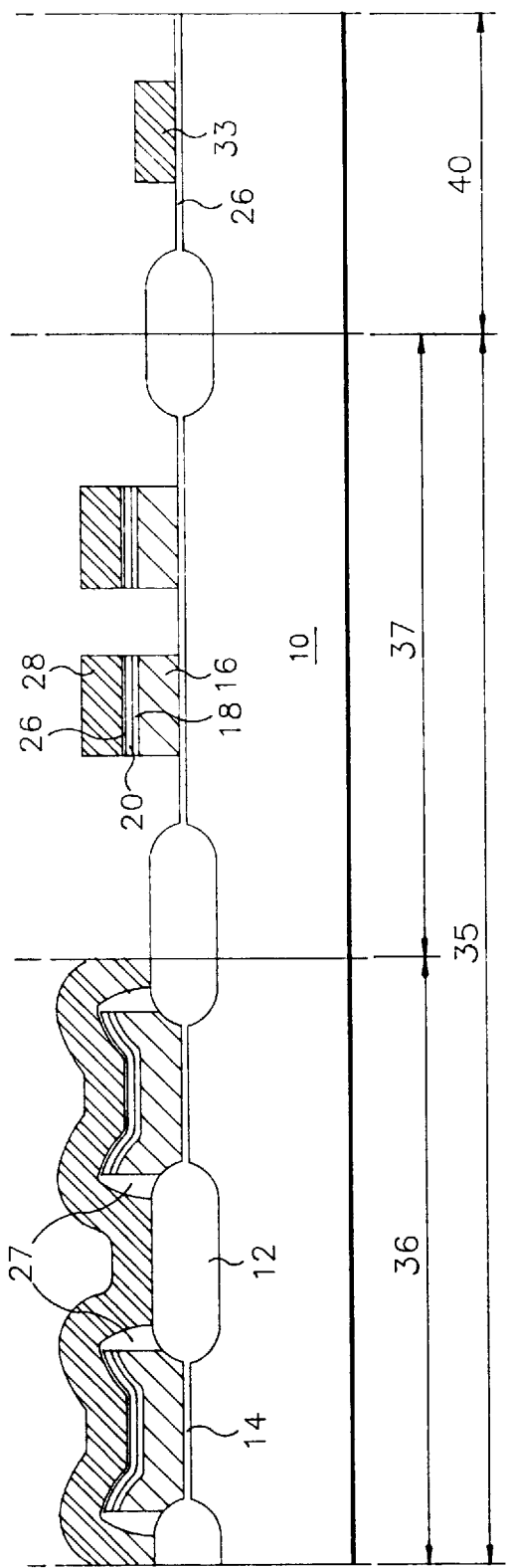
Figure 2:
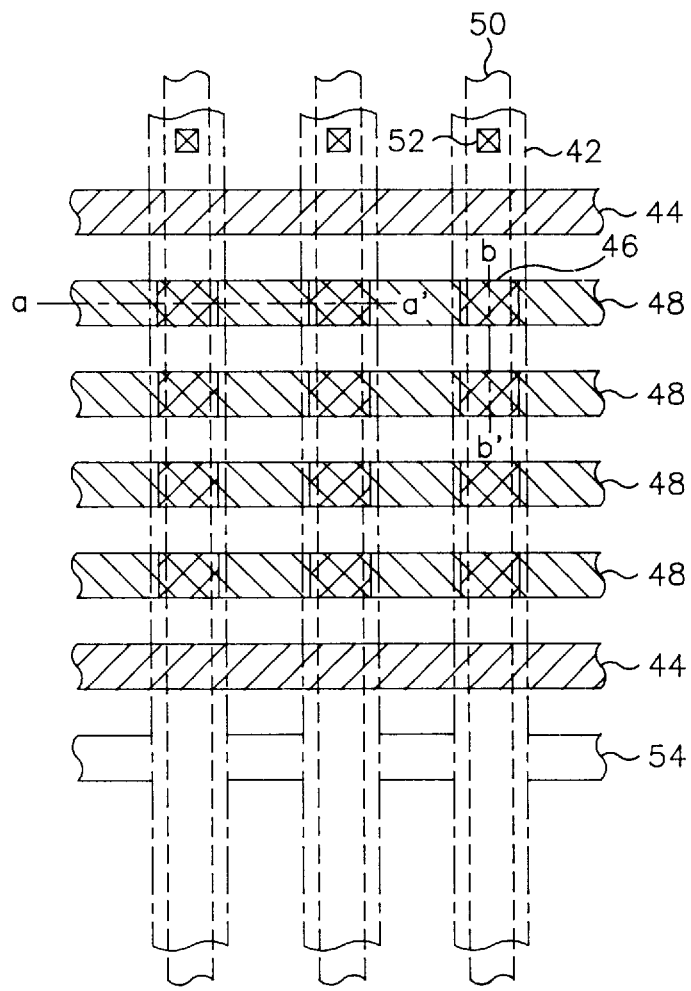
FIG. 2 shows a layout diagram of a storage cell area of a semiconductor device according to the present invention.

Referring now to FIG. 2, a description of a preferred embodiment of the present invention will be given taking as an exemplary an EEPROM cell having a NAND configuration. The layout of EEPROM shown in FIG. 2 includes an active area 42 vertically arranged for forming source and drain area, a first polycrystalline silicon line 44 horizontally arranged, and a first polycrystalline silicon area 46 for forming a floating gate of a storage cell. Over the polycrystalline silicon area 46, a second polycrystalline silicon line 48 is arranged in parallel with the first polycrystalline silicon line 44 for forming a control gate of the storage cell. The first polycrystalline silicon line 44 is used as a string selection line and a ground selection line for selecting a row of the storage cell array, and the second polycrystalline silicon line 48 is used as a word-line.

On the layout of this EEPROM are further included a bit-line 50 overlapping the first polycrystalline silicon area 46 and perpendicularly intersecting the first and second polycrystalline silicon lines 44 and 48, being formed on the second polycrystalline silicon line 48, a contact region 52 wherein a given area of the active area 42 and the bit-line 50 come in contact with each other, and a ground line 54 for grounding the source or drain of a floating gate memory.

Figure 3:
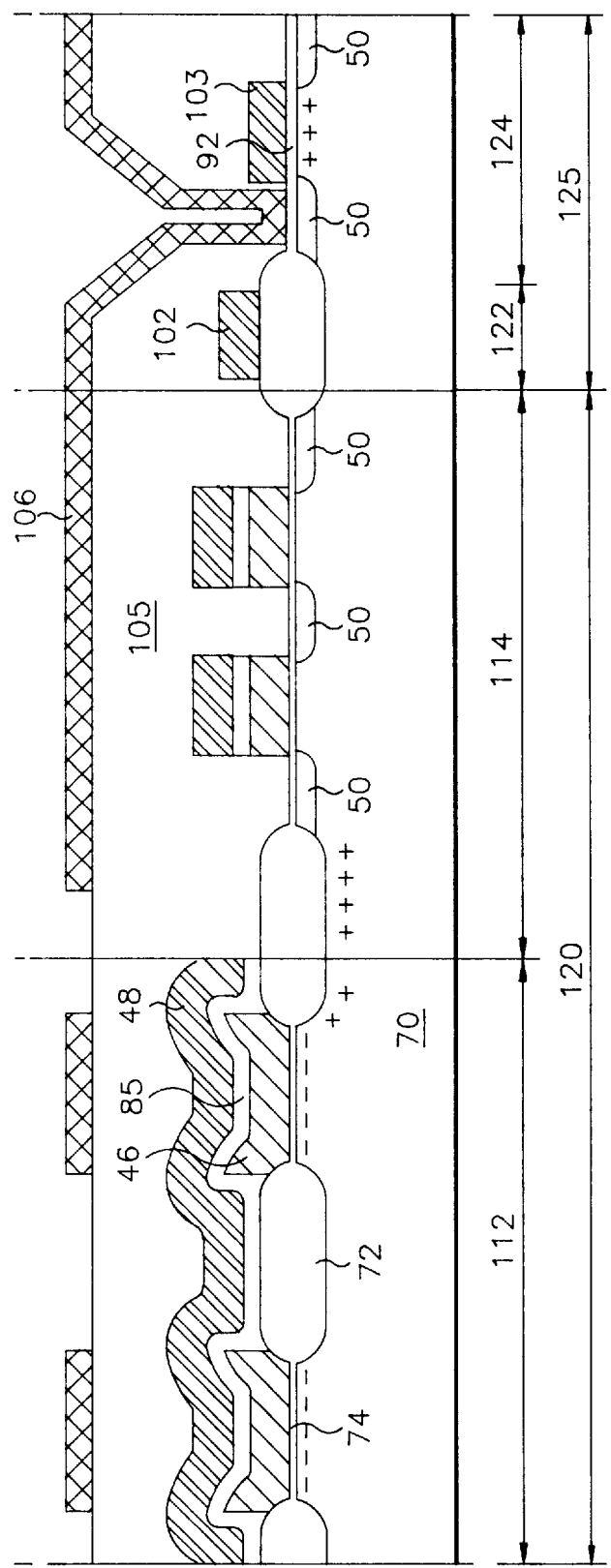
FIG. 3 shows a cross-sectional diagram of a semiconductor device according to the present invention.

FIG. 3 illustrates a cross-sectional view of a semiconductor device having a storage cell array and a peripheral circuit according to the present invention, wherein there are shown cross-sectional views 112 and 114 taken along the dotted lines a–a' and b–b' of FIG. 2 as well as a cross-sectional view 125 of the peripheral circuit area. The storage cell area 120 consists of a cross-sectional view 112 taken through the line a–a' of the word-line direction of the storage cell and a cross-section view 114 taken through the line b–b' of the bit-line direction of the storage cell. And the peripheral circuit area 125 consists of an internal connection area 122 for internally connecting the semiconductor device having the storage cell array and peripheral circuit, and a MOS transistor 124 for producing or selecting a pulse for selecting a specific storage cell of the storage cell array. In the drawing of FIG. 3 are shown a field oxide layer 72, source and drain regions 50 disposed separately from each other, and a floating gate 46 of the storage cell area 120 and a gate 103 of MOS transistor of the peripheral circuit area 125, which gates respectively have an intermediate layer of a first insulation layer 74 or a second insulation layer 92 on the semiconductor substrate 70 having the storage cell area 120 and the peripheral circuit area 125. Further shown are an internal connector 102 formed on the partial top surface of the field oxide layer 72 of the peripheral circuit area 125, an insulation layer 85 having O—N—O structure on the upper surface of the substrate 70, a control gate 48 on the upper surface of the insulation layer 85, and a metal wiring 106 extending over a third insulation layer 105 from a particular portion of the upper surface of the substrate 70.

Now, referring to FIGS. 4A to 4H, which show a series of fabrication steps of a non-volatile semiconductor memory device according to the present invention, further description will be made specifically by taking a preferred embodiment of fabricating an EEPROM cell having the NAND configuration shown in FIG. 2. Hereinafter, it has to be noted that same reference numerals are used for the same elements as used in FIGS. 2 and 3.

The starting material is a P-type semiconductor substrate having crystal plane (100), with a sheet resistance of $18\Omega/\square$ (ohms/square) and a substrate thickness of 62.5 $\mu$m. For better understanding of the present invention, the substrate is divided into two areas of a storage cell area and a peripheral circuit area so that their cross-sections could be seen simultaneously.

FIG. 4A is a process diagram of forming a floating gate of the storage cell area 120.

First, a field oxide layer 72 having a thickness between 9000 Å–11000 Å is formed on the surface of the semiconductor substrate 70 by employing local oxidation, and then the first insulation layer 74 having a thickness of 100 Å is formed on the surface of the substrate 70 to become a tunnel oxide layer of the storage cell. Here, the first insulation layer 74 is a silicon oxide layer. And then, a photo-resist layer (not shown herein) is coated on the substrate 70, a pattern is formed on the photo-resist layer and then impurities for controlling a threshold voltage of the storage cell are ion-injected while only the peripheral circuit area 125 of the substrate 70 is masked.

In the embodiment of the present invention, the ion-injection is performed with a dose of $2.5\pm10^{12}$ ions/cm$^2$ of arsenic (As) and an energy of 30 kev; thus, an initial threshold voltage of the storage cell becomes negative.

A first polycrystalline silicon layer is then deposited with a thickness of approximately 4000 Å on the surface of the substrate 70 and doped with POCl$_3$ so that sheet resistance of the first polycrystalline silicon layer becomes $50\Omega/\square$. And after a first photo-resist layer 78 is coated on the surface of the first polycrystalline silicon layer, a pattern is formed with parallel arrangement in the direction of the word-line and extended in the direction of the bit-line, by which pattern the first polycrystalline silicon layer is selectively etched to form the floating gate 46 in the word-line direction of the storage cell area 120 as illustrated in the cross-section view of the word-line direction of the storage cell area 120. Here, the polycrystalline silicon layer 46a has been not yet etched out in the storage cell area 120 cross-section view 114 of the bit-line direction of the storage cell area 120. And then the portion of the first photo-resist layer 78 is removed.

Turning now to FIG. 4B, which illustrates a process of forming an O—N—O insulation layer in between a floating gate and a control gate, after a lower oxide layer 80 having a thickness of approximately 160 Å is formed by the thermal oxidation on the top surface of the substrate 70, on which the floating gate 46 and the first polycrystalline silicon layer 46a shown in the cross-section view 114 of the bit-line direction of the storage cell area are formed, a nitride layer 82 having a thickness of approximately 200 Å is successively formed on the substrate 70 by employing a Low-pressure Chemical Vapor Deposition (LPCVD) method. And then, a upper oxidation layer 84 having a thickness of approximately 30 Å is formed over the substrate 70 by subjecting to a wet thermal oxidation process for about twenty minutes at a temperature of about 1000° C., so that the O—N—O insulation layer 85 is formed thereon. Due to the formation of such an O—N—O insulation layer 85, the insulation in between the floating gate 46 and a control gate, which is to be further described in the following, is improved and its capacitance is increased as well.

Figure 4C:
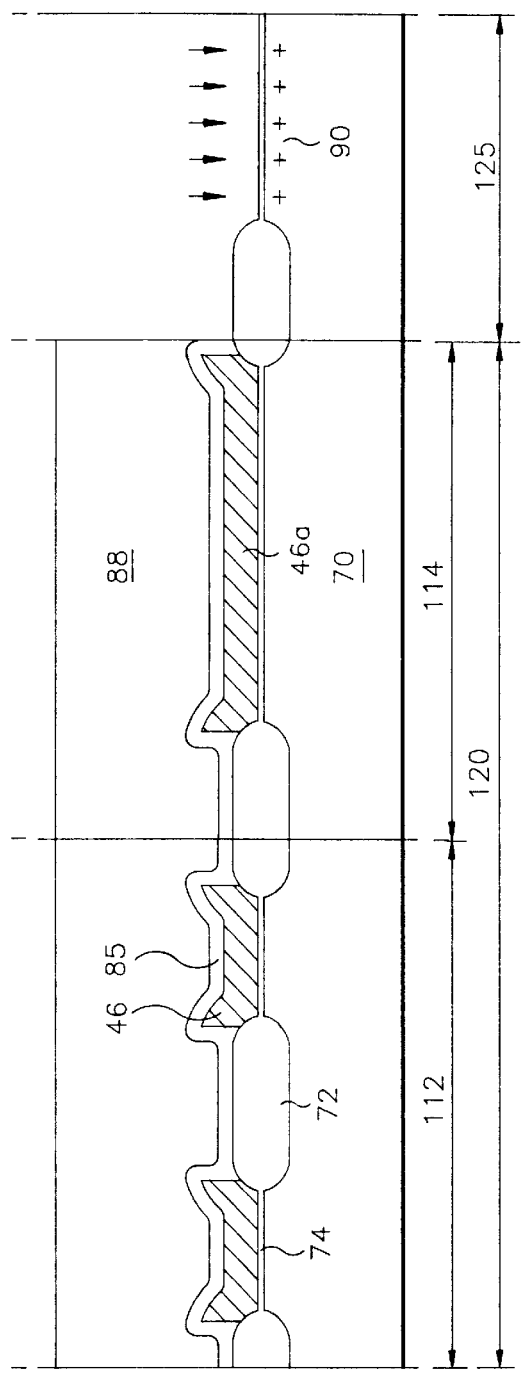

Referring now to FIG. 4C, which illustrates a process of removing the O—N—O insulation layer 85 excepting for the top surface on the storage cell area 120, a second photo-resist layer 88 is coated on the entire surface of the substrate 70 and then a pattern is formed thereon to remove the O—N—O insulation layer 85 of the peripheral circuit area 125. Ion-implantation of given impurities are made to control a threshold voltage of the MOS transistors that are formed in the peripheral circuit area 125. In the embodiment of the present invention, boron having a dose of $7.0\times10^{11}$ ions/cm$^2$ is ion-injected with an energy of 50 kev. Then, the first insulation layer 74 is removed from the surface of peripheral circuit area. By this process, upper and side surfaces of the floating gate 46 of the storage cell area 120 are covered by the O—N—O insulation layer 85.

Figure 4D:
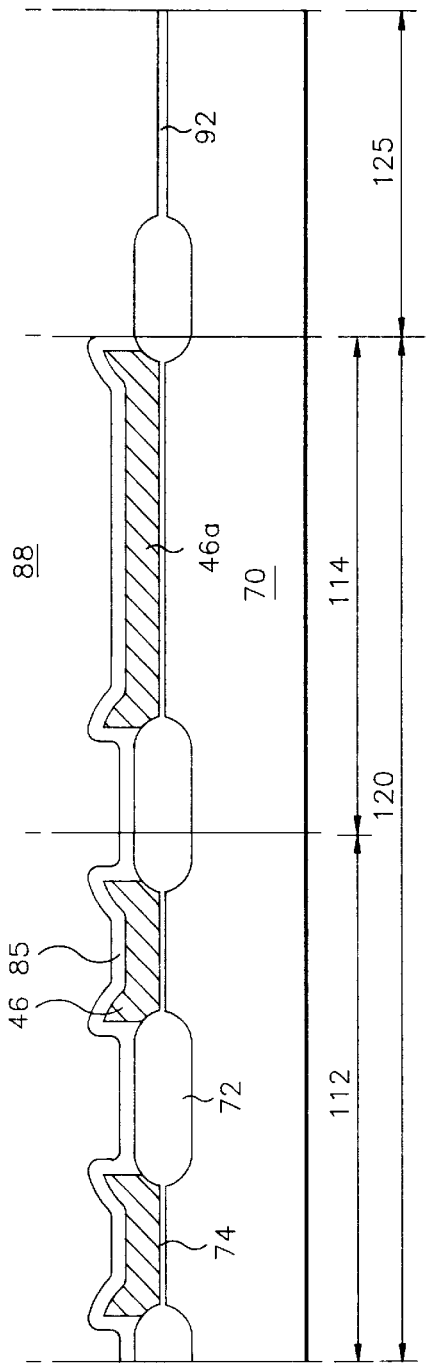

Thereafter, as shown in FIG. 4D, a second insulation layer 92 having a thickness of 350 Å is formed on the surface of the substrate 70 after the second photo-resist layer 88 is removed. Growth of the second insulation layer 92 is extremely poor on the surface of the upper oxide layer of the O—N—O insulation layer 85 but much more on the exposed surface of the peripheral circuit area 125 of the substrate 70. Therefore, the thickness of the second insulation layer 92, which will serve as a gate oxide layer of the peripheral circuit area 125, can be easily controlled to have an optimum thickness for a good circuit operation. Herein, the second insulation layer 92 is a silicon oxide layer.

Referring now to FIG. 4E showing a process of forming a second polycrystalline silicon that will form a control gate of the storage cell and a gate of the peripheral circuit, a second polycrystalline silicon layer 94 having a thickness of 4000 Å is coated on the surface of the substrate 70, and is then doped with $POCl_3$ to have a sheet resistance of approximately 22Ω/□. The lower the resistance that the second polycrystalline silicon layer 94 has, the lower the power that is consumed during the circuit operation because the second polycrystalline is used as a control gate of the storage cell, that is, a word-line. Accordingly, the second polycrystalline silicon layer can be replaced by a silicide layer.

Turning now to FIG. 4F illustrating a process of forming a control gate of the storage cell, a third photo-resist layer 96 is coated on surface of the substrate 70, a given pattern is made thereon extended in the direction of the word-line and arrayed in parallel in the direction of the bit-line, and then etching is performed on the second polycrystalline silicon layer 94 as well as on the O—N—O insulation layer 85 and the first polycrystalline silicon layer of the area, from which the third photo-resist layer 96 is removed, to form the control gate 48 of the storage cell area 120. By this process, the floating gate 46 and the control gate 48 of the storage cell area 120 are etched in self-aligned mode as shown in the cross-section view of the bit-line direction. Accordingly, the control gate 48 can be deposited on the floating gate 46 correctly so that misalignment with source and drain area, which will be further described later, can be prevented. Here, a upper surface of the peripheralcircuit area 125 is protected by the third photo-resist layer 96.

As shown in FIG. 4F, only the O—N—O insulation layer 85 is formed in between the floating gate 46 and the control gate 48 of the storage cell area 120. Especially, in the word-line direction 112 of the storage cell area 120, not only the upper surface but also side surface of the floating gate 46 are enclosed with O—N—O insulation layer 85, thereby leading to increase of the insulation capability and capacitance.

Turning now to FIG. 4G showing a process of forming internal connection and a gate of the peripheral circuit area, a fourth photo-resist layer 100 is coated on the surface of the substrate 70, a mask pattern is made thereon and then etching is performed on the second polycrystalline silicon layer of the area from which the fourth photo-resist layer 100 is removed, thereby forming the internal connection 102 and gate 103 of the peripheral circuit area 125. Here, the storage cell area 120 is protected by the fourth photo-resist layer 100.

Referring now to FIG. 4H showing a process of forming source and drain areas in the storage cell area and the peripheral circuit area, after the fourth photo-resist layer 100 is removed, arsenic having a dose of $6.0 \times 10^{15}$ ions/cm$^2$ is ion-implanted with an energy of 75 kev from the upper part of the substrate 70, and then a given thermal process is performed so as to form source and drain area 50 that serve as an active area. Thereafter, a high-temperature oxide layer having a thickness of 1500 Å is formed on the surface of the substrate 70 and a BPSG (Boro-Phospo Silicate Glass) layer having a thickness of 7000 Å is deposited thereon, and then a flattening process is performed for 30 minutes in an environment of 925° C. and $N_2$ gas so as to form an inter-layer insulation layer 105 in between wirings and elements. Then, a contact area is formed on the top surface of the peripheral circuit area 125 by a given etching process, and a metal layer of 1 μm is coated on the top surface of the substrate 70 to make a mesh pattern and then wiring 106 is formed by performing a particular thermal process, thereby completing a semiconductor device having a storage cell and peripheral circuit.

Of the foregoing process, particularly in the process illustrated in FIG. 4B where the O—N—O insulation layer is formed, the growth rate of the lower oxide layer 80 increases proportionately according to the doping concentration of the first polycrystalline silicon layer, and the more the doping concentration increases the more difficult it becomes to control the thickness of the lower oxide layer. Therefore, the conductive layer under the O—N—O insulation layer should be preferably a polycrystalline silicon layer having a given resistance.

In the preferred embodiment of the present invention, both the first conductive layer forming the floating gate of the storage cell area and the second conductive layer forming the control gate of the storage cell area, internal connections and the gate of the MOS transistor are formed of polycrystalline silicon. However, in another embodiment of the present invention, the second conductive layer may be replaced by a low-resistance conductive layer made of a material such as tungsten silicide, titanium silicide, a tantalum silicide.

Accordingly, the control gate of the storage cell, the internal connections of the peripheral circuit and gate of the transistor can be formed of the low-resistance silicide layer so that word- line delay can be efficiently prevented and their power consumption be dramatically reduced.

In the meantime, in the embodiment of the present, mask patterns of the floating gate and the control gate of the storage cell area are completed after the peripheral circuit area has been protected by the photo-resist layer as illustrated in FIG. 4F, and then the gate of the transistor and the internal connections of the peripheral circuit area are formed after the storage cell area has been protected by the photo-resist layer as shown in FIG. 4G. However, in another embodiment of the present invention, the process of FIG. 4F can be performed after the process of FIG. 4G.

Furthermore, in the embodiment of the present invention, a typical EEPROM cell having a NAND structure has been taken as an exemplary; however, it should be noted that other embodiments and modifications of the present invention can be easily predicted by an expert in the art without departing from the scope of the present invention as to fabricating a non-volatile semiconductor memory device having a storage cell array and peripheral circuit.

As apparent from the foregoing description, the present invention has an advantage that a thickness of the gate oxide layer on the top surface of the peripheral circuit area can be easily controlled independently of a thickness of the O—N—O insulation layer by utilizing the fact that any oxide layer is nearly formed on the surface of the O—N—O insulation layer, wherein it is also achieved by performing a process of forming an oxide layer on the exposed top surface of the substrate in the peripheral circuit area as well as the top surface of the O—N—O insulation layer, after formation of the O—N—O insulation layer on the top surface of the floating gate of the storage cell area.

The present invention has another advantage in that the capacitance necessary for a good circuit operation can be sufficiently secured even where the semiconductor components are extremely high integrated owing to the fact that not only the upper surface of the floating gate as in the prior art but also surfaces of the both sides of the floating gate can contribute to increase its capacitance. The reason why is that not only the upper surface but also both of side surfaces of the floating gate are covered in the direction of the word-line of the storage cell array by forming the O—N—O insulation layer on the surface of the substrate after a mask pattern of the floating gate of the of the storage cell area is formed.

The present invention has still another advantage that the insulation layer can be formed with a greater capacitance and a better insulation capability due to formation of the O—N—O structure, which has excellent insulation quality, in between the floating gate and the control gate.

The present invention has a further advantage that a semiconductor element having lower power consumption and reduced word-line delay can be realized by using a low-resistance silicide layer in forming the control gate of the storage cell area, internal connections and a gate of the peripheral circuit area.

The present invention has still furter advantage that the occurrence of misalignment against any active area can be effectively prevented by letting the first and second polycrystalline silicon layers be etched out in a self-alignment mode along the direction of the word-line during formation of the control gate of the storage cell area.

While the invention has been particularly shown and with reference to a preferred embodiment, it will be apparent to those skilled in the art that modifications may be made without departing from the spirit and scope of the invention.

What is claimed is:

1. A non-volatile semiconductor memory device having a storage cell area including a plurality of word lines and bit lines perpendicular to the word lines forming an array, comprising:

a plurality of field oxide layers formed in said storage cell area to separate adjacent storage cells along a direction of the word lines;

a floating gate disposed between successive field oxide layers;

a control gate disposed over the floating gate and the field oxide layers, and elongated along said direction of the word lines; and an oxide-nitride-oxide insulation layer interposed between a bottom surface of said control gate and a top surface of said field oxide layers and top and side surfaces of said floating gate, and elongated along said direction of the word lines; said oxide-nitride-oxide insulation layer solely being formed on top and side surfaces of said floating gate in said direction of the word lines and absent firm side surfaces of said floating gate in said direction of the bit lines.

2. A memory device, comprising:

a substrate including a storage cell areas having a plurality of word lines and bit lines perpendicular to the word lines forming a memory cell array and a peripheral circuit area;

a plurality of spaced-apart field oxide layers disposed in said storage cell area alternately along a direction of said word lines;

a first insulation layer disposed in said storage cell area and formed between said spaced-apart field oxide layers along said direction of said word lines;

a plurality of floating gates for said memory cell array formed on said first insulation layer and spaced-apart in said direction of said bit lines and said word line;

an oxide-nitride-oxide insulation layer formed on said spaced-apart field oxide layers and said spaced-apart floating gates;

a plurality of control gates for said memory cell array formed on said oxide-nitride-oxide insulation layer and spaced-apart in said direction of said bit lines; and a transistor gate disposed in said peripheral circuit area.

3. The memory device of claim 2, further comprised of said first insulation layer being formed by tunnel oxide.

4. The memory device of claim 2, further comprised of said floating gates and said control gates being formed by polycrystalline silicon coated using a low-pressure chemical vapor deposition process and doped with phosphorous oxychloride.

5. The memory device of claim 2, further comprised of said control gate exhibiting conduction resistance lower than said floating gate.

6. The memory device of claim 2, further comprised of said control gate being formed from one of tungsten silicide, titanium silicide, and tantalum silicide materials.

7. The memory device of claim 2, further comprised of said oxide-nitride-oxide insulation layer being formed from a successive accumulation of a lower oxide layer formed by a thermal oxidation process, a nitride layer process by the low-pressure chemical vapor deposition process, and an upper oxide layer formed by a wet thermal oxidation of said nitride layer for about twenty minutes at a temperature of 100° C.

8. The memory device of claim 7, further comprised of said lower oxide layer being formed by a deposition process, and said upper oxide layer being formed by a deposition process from a mixture of a thermal oxide layer and a deposited oxide layer.

9. The memory device of claim 2, further comprised said oxide-nitride-oxide insulation layer comprising:

a first oxide layer having a thickness of approximately 160 angstroms formed on said plurality of floating gates by a thermal oxidation process;

a nitride layer having a tickness of approximately 200 angstroms formed on said fast oxide layer by a low-pressure chemical vapor deposition process; and a second oxide layer having a thickness of approximately 30 angstroms formed on said a nitride layer by a wet thermal oxidation process.

10. A memory device having a storage cell region and a peripheral circuit region on a substrate, comprising:

a plurality of spaced-apart field oxide layers disposed in said storage cell region having a memory cell array formed by a plurality of bit lines and a plurality of word lines;

a first insulation layer formed between said spaced-apart field oxide layers;

a plurality of floating gates formed on said first insulation layer;

a second insulation layer formed on a planar surface of and side-walls of said plurality of floating gates;

a plurality of control gates formed on said plurality of floating gates in said storage cell region via said second insulation layer;

a gate oxide layer disposed in said peripheral circuit region; and transistor gates disposed above said gate oxide layer in said peripheral circuit region.

11. The memory device of claim 10, further comprised of said second insulation layer comprising:

a first oxide layer having a thickness of approximately 160 angstroms formed on said plurality of floating gates by a thermal oxidation process;

a nitride layer having a thickness of approximately 200 angstroms formed on said first oxide layer by a low-pressure chemical vapor deposition process; and a second oxide layer having a thickness of approximately 30 angstroms formed on said nitride layer by a wet thermal oxidation process.

12. The memory device of claim 10, further comprised of each of said floating gates and said control gates being doped with phosphorus oxychloride, and having a thickness of approximately 4000 angstroms.

13. The memory device of claim 10, further comprised of said control gate being formed from one of tungsten silicide, titanium silicide and tantalum silicide materials.

* * * * *